(12) United States Patent
Lee

(10) Patent No.: US 6,194,760 B1
(45) Date of Patent: Feb. 27, 2001

(54) DOUBLE-DIFFUSED MOS TRANSISTOR AND METHOD OF FABRICATING THE SAME

(75) Inventor: Sun-Hak Lee, Kyonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/215,372

(22) Filed: Dec. 18, 1998

(30) Foreign Application Priority Data

Dec. 19, 1997 (KR) .................................................. 97-70439

(51) Int. Cl.$^7$ .................................................. H01L 29/72

(52) U.S. Cl. ........................... 257/328; 257/327; 257/335; 257/345; 438/156; 438/163; 438/194; 438/212; 438/300

(58) Field of Search ..................................... 257/335, 328, 257/345, 327; 438/156, 163, 194, 212, 300

(56) References Cited

U.S. PATENT DOCUMENTS 6,043,532 * 3/2000 Depetro et al. ........................ 257/335

* cited by examiner

*Primary Examiner*—Edward Wojciechowicz
(74) *Attorney, Agent, or Firm*—Jones Volentine, L.L.C.

(57) ABSTRACT

There are provided a double-diffused MOS (Metal Oxide Semiconductor) transistor and a fabricating method thereof. In the double-diffused MOS transistor, a buried layer of a first conductive type and an epitaxial layer of the first conductive type are sequentially formed on a semiconductor substrate, and a gate electrode is formed on the epitaxial layer of the first conductive type with interposition of a gate insulating film. Source and drain regions of the first conductive type are formed in the surface of the epitaxial layer of the first conductive type in self-alignment and non-self-alignment with the gate electrode, respectively. A body region of a second conductive type is formed in the surface of the epitaxial layer of the first conductive type to be surrounded by the source region of the first conductive type, and a bulk bias region of the second conductive type is formed in the body region of the second conductive type under the source region of the first conductive type.

13 Claims, 5 Drawing Sheets

DOUBLE-DIFFUSED MOS TRANSISTOR AND METHOD OF FABRICATING THE SAME

BACKGROUND OF THE INVENTION

1. Field of the Invention

The present invention relates to a semiconductor device and a fabricating method thereof, and in particular, to a double-diffused metal oxide semiconductor (DMOS) transistor and a fabricating method thereof, which can reduce on-resistance (Rds) by decreasing chip size.

2. Description of the Related Art

Semiconductor technology has recently been moving toward integrating power devices such as DMOS transistors, IGFETs (Insulated Gate Field Effect Transistors), and the like on a chip in a high density. These power devices, finding their wide use as individual devices and power ICs (Integrated Circuits), have channels formed by double-diffusion.

In particular, a DMOS transistor, obtained by double-diffusion, has impurity regions of different conductive types formed by sequentially diffusing impurities of different conductive types through a hole in an insulating layer. The double-diffusion structure of the DMOS transistor enables a short channel to be formed with high precision and the DMOS transistor to operate at high speed. DMOS transistors are grouped into vertical DMOS (VDMOS) transistors and lateral DMOS (LDMOS) transistors according to their current paths.

FIG. 1 is a sectional view of a conventional N-channel DMOS transistor. Referring to FIG. 1, an N+ buried layer 12 is formed on a P-type semiconductor substrate 10, and an N-type epitaxial layer 14 is formed over the substrate 10 and the N+ buried layer 12. A device isolation region 17 is formed over the N-type epitaxial layer 14, and an N+ sink region 16 is formed under a drain contact forming area by diffusing an N-type impurity of high concentration into the N+ buried layer 12.

A gate electrode 20 is formed over the N-type epitaxial layer 14 with a gate oxide film 18 formed between the two. A P-type body region 22 is formed into the surface of the N-type epitaxial layer 14, and an N+ source region 24 is formed to be surrounded by the P-type body region 22 in self-alignment with the gate electrode 20. An N+ drain region 26 is formed into the surface of the N-type epitaxial layer 14 in non-self-alignment with the gate electrode 20 from the outside thereof A channel region (not shown) is formed into the surface of the P-type body region 22 partially overlapped with the gate electrode 20.

An insulating layer 30 having a contact hole is formed over the N-type epitaxial layer 14 including the gate electrode 20. A metal layer 32 is formed in the contact hole of the insulating layer 30 to make contact with the gate electrode 20, the N+ source and drain regions 24 and 26, and the P-type body region 22 in the DMOS transistor.

In the conventional DMOS transistor as constituted above, a bulk bias region 28 should be formed to simultaneously make contact between the metal layer 32 and the N+ source region 24 and between the metal layer 32 and the P-type body region 22. In this way, the entire chip size is increased, in turn, increasing on-resistance.

SUMMARY OF THE INVENTION

To circumvent the above problems, an object of the present invention is to provide a DMOS transistor which can reduce chip size to lower on-resistance (Rds).

Another object of the present invention is to provide a suitable method of fabricating the above DMOS transistor.

To achieve the first object, there is provided a double-diffused MOS transistor. The double-diffused MOS transistor includes a semiconductor substrate, a buried layer of a first conductive type formed on the semiconductor substrate, an epitaxial layer of the first conductive type formed over the semiconductor substrate and the buried layer, a gate insulating film formed over the epitaxial layer, a gate electrode formed over the gate insulating film, a source region of the first conductive type formed in the surface of the epitaxial layer in self-alignment with the gate electrode, a drain region of the first conductive type formed in the surface of the epitaxial layer in non-self-alignment with the gate electrode, a body region of a second conductive type formed in the surface of the epitaxial layer and surrounding the source region, and a bulk bias region of the second conductive type formed below the source region at a greater depth than the source region.

Preferably, a sink region of the first conductive type is formed from under the drain region to the buried layer to reduce drain resistance.

In addition, an insulating layer may be formed on the epitaxial layer including the gate electrode, and a metal layer may be formed on the insulating layer, for making contact with the gate electrode, the source and drain regions of the first conductive type, and the bulk bias region.

To achieve the second object of the present invention, there is provided a double-diffused MOS transistor fabricating method. The double-diffused MOS transistor fabricating method includes the steps of sequentially forming a buried layer of a first conductive type and an epitaxial layer of the first conductive type over a semiconductor substrate, forming a gate insulating film over the epitaxial layer, forming a gate electrode over the gate insulating film, forming a body region of a second conductive type in the surface of the epitaxial layer by ion-implanting an impurity of the second conductive type using a photomask, forming a source region of the first conductive type into the surface of the epitaxial layer by ion-implanting an impurity of the first conductive type into the surface of the resultant structure, forming a drain region of the first conductive type into the surface of the epitaxial layer by ion-implanting an impurity of the first conductive type into the surface of the resultant structure, and forming a bulk bias region of the second conductive type below the source region by ion-implanting an impurity of the second conductive type into an area having a width smaller than that of the source region using a photomask.

A sink region of the first conductive type may be formed by ion-implanting an impurity of the first conductive type into a drain forming area and diffusing the ion-implanted impurity to the buried layer. This step is performed after the step of sequentially forming the buried layer of the first conductive type and the epitaxial layer of the first conductive type, and serves to reduce drain resistance.

Preferably, no photomask is used in the step of forming the source and drain regions of the first conductive type.

After the step of forming the bulk bias region of the second conductive type, an insulating layer is formed on the surface of the resultant structure, the insulating layer is etched over the area having a width smaller than that of the source region of the first conductive type, the exposed epitaxial layer is etched to the body region, the insulating layer on the drain region and the gate electrode is etched, and a metal layer is formed on the surface of the resultant structure.

To achieve the second object of the present invention, there is provided a double-diffused MOS transistor. The double-diffused MOS transistor includes an epitaxial layer of a first conductive type, a gate electrode formed over the epitaxial layer, a source region of the first conductive type formed in the surface of the epitaxial layer, a drain region of the first conductive type formed in the surface of the epitaxial layer, a body region of a second conductive type formed in the surface of the epitaxial layer and surrounding the source region, and a bulk bias region of the second conductive type formed in the body region of the second conductive type at a depth greater than the source region.

In addition, a sink region of the first conductive type is formed from under the drain region to reduce drain resistance. Also, an insulating layer may be formed over the epitaxial layer and the gate electrode. A metal layer may also be formed over the epitaxial layer, for making contact with the gate electrode, the source and drain regions, and the bulk bias region.

Preferably the source region is self-aligned with the gate electrode and the drain region is non-self-aligned with the gate electrode.

According to the present invention, an area for bulk bias is saved because the bulk bias region of the second conductive type is formed under the source region of the first conductive type. Therefore, chip size is reduced and on-resistance is lowered.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
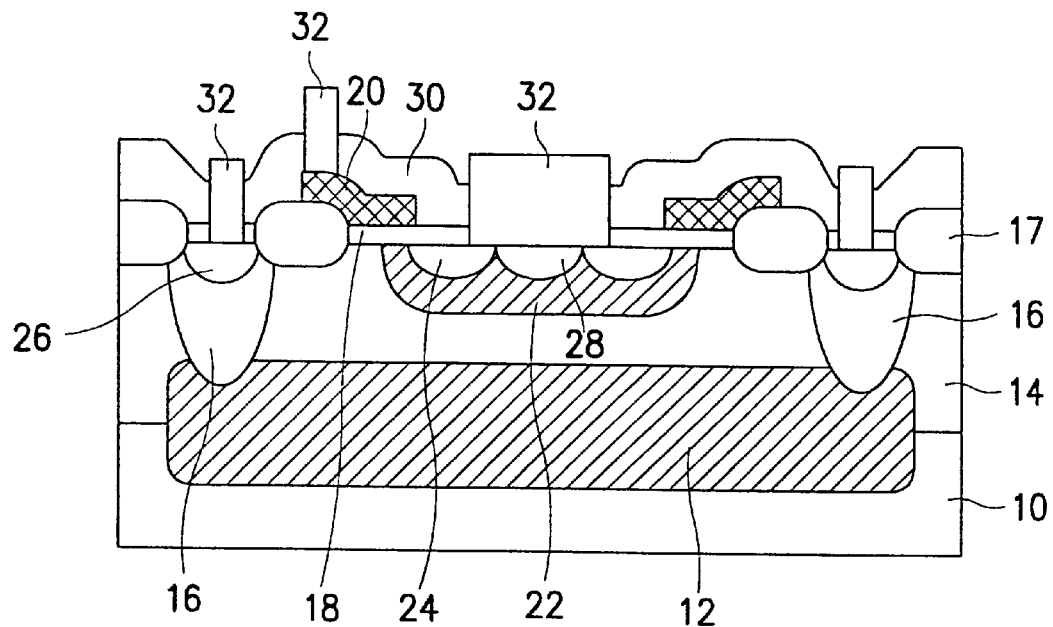
FIG. 1 is a sectional view of a conventional DMOS transistor.
Figure 2:
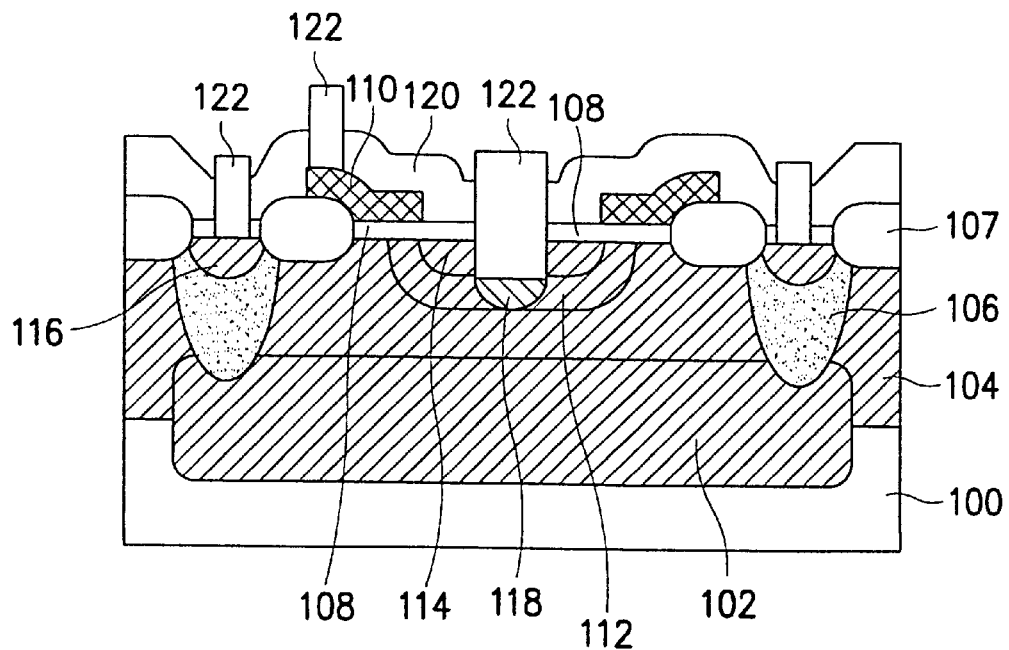
FIG. 2 is a sectional view of a DMOS transistor according to the present invention.

FIG. 2 is a sectional view of a DMOS transistor according to the present invention. Referring to FIG. 2, an N+ buried layer 102 is formed on a P-type semiconductor substrate 100 to provide a low-resistance path from a drain contact to an active region of the transistor, to reduce drain resistance. An N-type epitaxial layer 104 is formed over the substrate 100 and the N+ buried layer 102. A device isolation layer 107 is formed over the N-type epitaxial layer 104, and an N+ sink region 106 is formed by diffusing an N-type impurity of high concentration from under a drain contact forming area to the N+ buried layer 102, to reduce the drain resistance.

A gate electrode 110 is formed over the N-type epitaxial layer 104 with a gate oxide film 108 formed between the two. A P-type body region 112 is formed into the surface of the N-type epitaxial layer 104, and an N+ source region 114 is formed in to be surrounded by the P-type body region 112 in self-alignment with the gate electrode 110. An N+ drain region 116 is formed into the surface of the N-type epitaxial layer 104 in non-self-alignment with the gate electrode 110 from the outside thereof Thus, the gate electrode 110 has an off-set structure. In addition, a channel region (not shown) is formed into the surface of the P-type body region 112 partially overlapped with the gate electrode 110.

A P+ bulk bias region 118 for bulk bias is formed into the surface of the P-type body region 112 at a depth greater than the N+ source region 114. In the present invention, an area for bulk bias is saved because the P+ bulk bias region 118 is formed below the N+ source region 114.

An insulating layer 120 having a plurality of contact holes is formed over the N-type epitaxial layer 104 including the gate electrode 110. A metal layer 122 is formed in the contact holes of the insulating layer 120 to make contact with the gate electrode 110, the N+ source and drain regions 114 and 116, and the P+ body region 118 in the DMOS transistor. Because the P+ body region 118 is formed below the N+ source region 114, the metal layer 122 contacting the N+ source region 114 and the P+ body region 118 can be formed to contact the sides of the N+ source region 114 and so need not be as wide as in conventional designs.

FIGS. 3 to 9 are sectional views sequentially illustrating the steps of a fabricating method of the DMOS transistor shown in FIG. 2.

Figure 3:
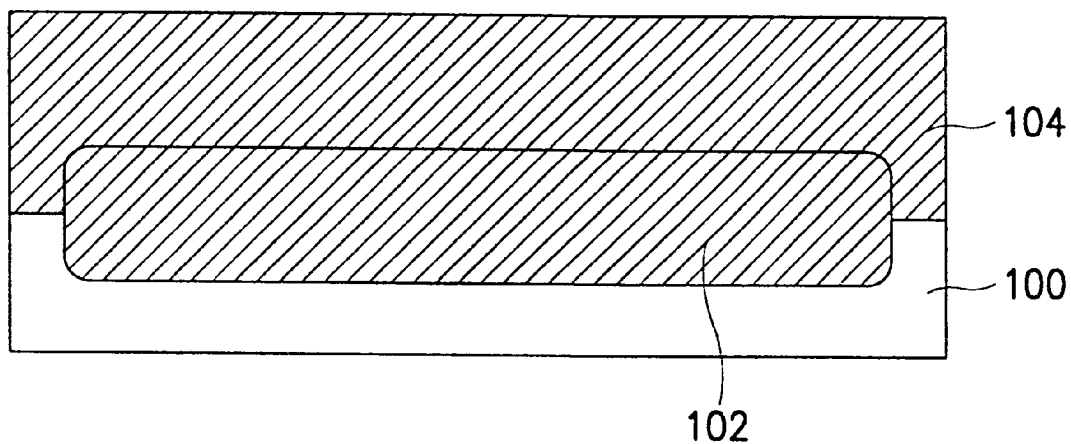
FIGS. 3 to 9 are sectional views sequentially illustrating the steps of a fabricating method of the DMOS transistor shown in FIG. 2.

FIG. 3 illustrates the step of forming the N-type epitaxial layer 104. The P-type semiconductor substrate 100 is first prepared, and then the N+ buried layer 102 is formed on the P-type substrate 100 to provide a low-resistance path from a drain contact to an active region of the transistor, to reduce drain resistance. Preferably, the N+ buried layer 102 is formed by diffusion or ion implantation.

An N-type epitaxial layer 104 is then formed over the P-type substrate 100 and the N+ buried layer 102 by epitaxial growth.

Figure 4:
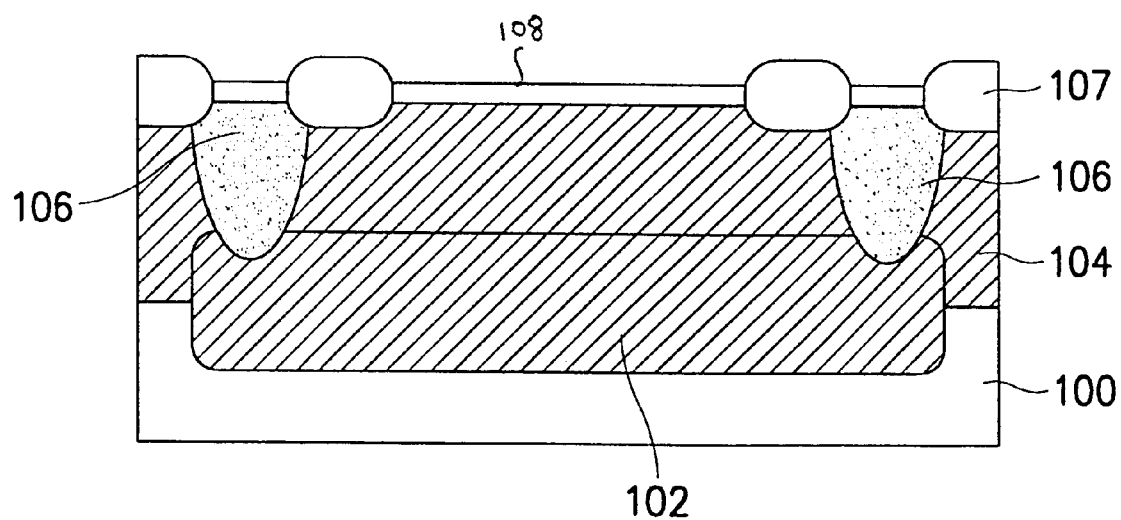

FIG. 4 illustrates the step of forming the N+ sink regions 106. After the N-type epitaxial layer 104 is formed, the N+ sink regions 106 are formed by diffusing an N-type impurity of high concentration from under a drain contact forming area to the N+ buried layer 102. Here, the N+ sink regions are for a VDMOS transistor, not for an LDMOS transistor.

Subsequently, the device isolation layer 107 is formed on the N-type epitaxial layer 104 by a general device isolation process, for example, LOCOS (Local Oxidation Of Silicon), to thereby define an active region for forming the transistor. After the active region is defined, the gate oxide film 108 is formed on the active region by thermal oxidation.

Figure 5:
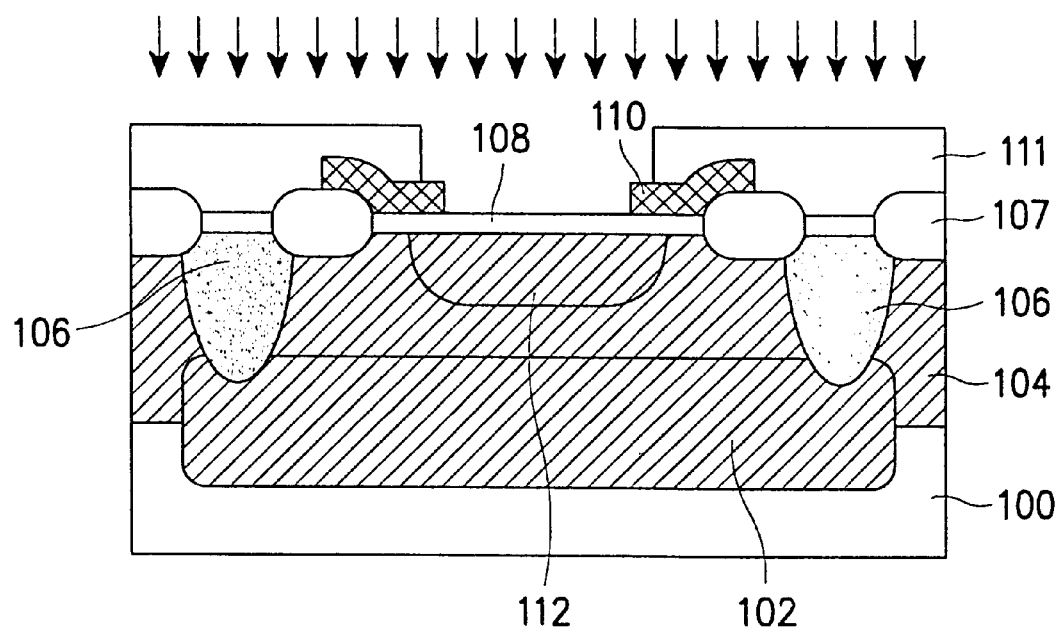

FIG. 5 illustrates the step of forming the P-type body region 112. A conductive material, for example, a polysilicon film doped with an impurity is deposited on the gate oxide film 108 and is patterned by photolithography, thereby forming the gate electrode 110.

Afterwards, a photoresist pattern 111 is formed by photolithography to open a P-type body region forming area, a P-type impurity is ion-implanted using the photoresist pattern 111 as an ion implanting mask. Then, the photoresist pattern 111 is removed and the P-type body region 112 is formed by diffusing the ion-implanted P-type impurity using a predetermined thermal treatment process.

Figure 6:
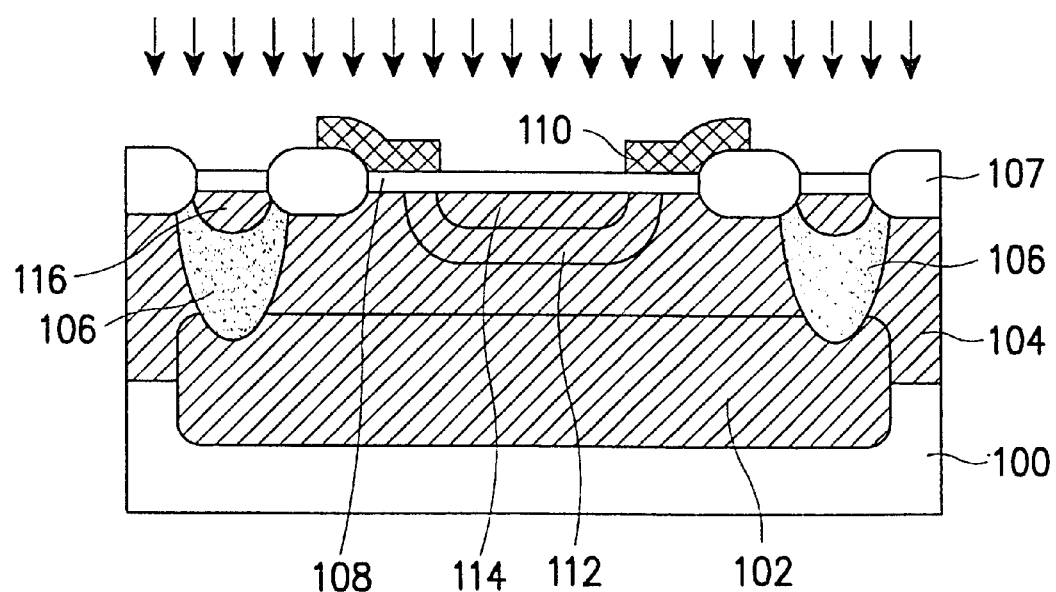

FIG. 6 illustrates the step of forming the N+ source and drain regions 114 and 116. After the P-type body region 112 is formed, an N-type impurity is ion-implanted into the overall surface of the resultant structure. Thus, the N+ source and drain regions 114 and 116 are simultaneously formed in self-alignment and non-self-alignment to the gate electrode 110, respectively.

Figure 7:
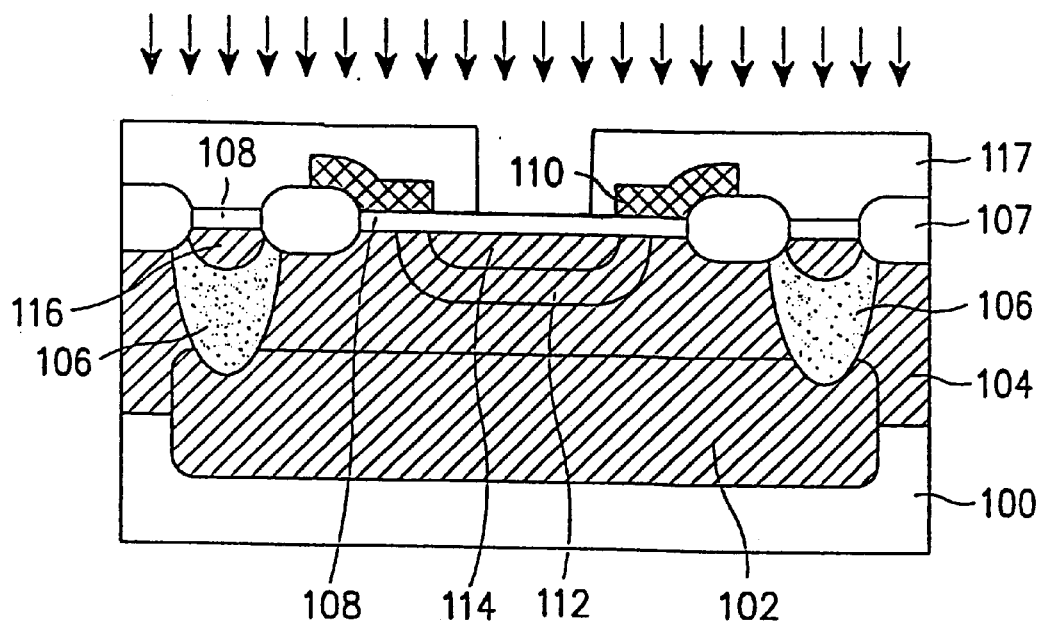

FIG. 7 illustrates the step of forming the P+ bulk bias region 118. After the N+ source and drain regions 114 and 116 are formed, a photoresist pattern 117 is formed over the substrate 100 and gate electrode 110 by photolithography to open an area having a width smaller than that of the N+ source region 114. Then, with the photoresist pattern 117 used as an ion implanting mask, a P-type impurity is ion-implanted under the N+ source region 114 at a high energy. As a result, the P+ bulk bias region 118 is formed under the N+ source region 114.

Figure 8:
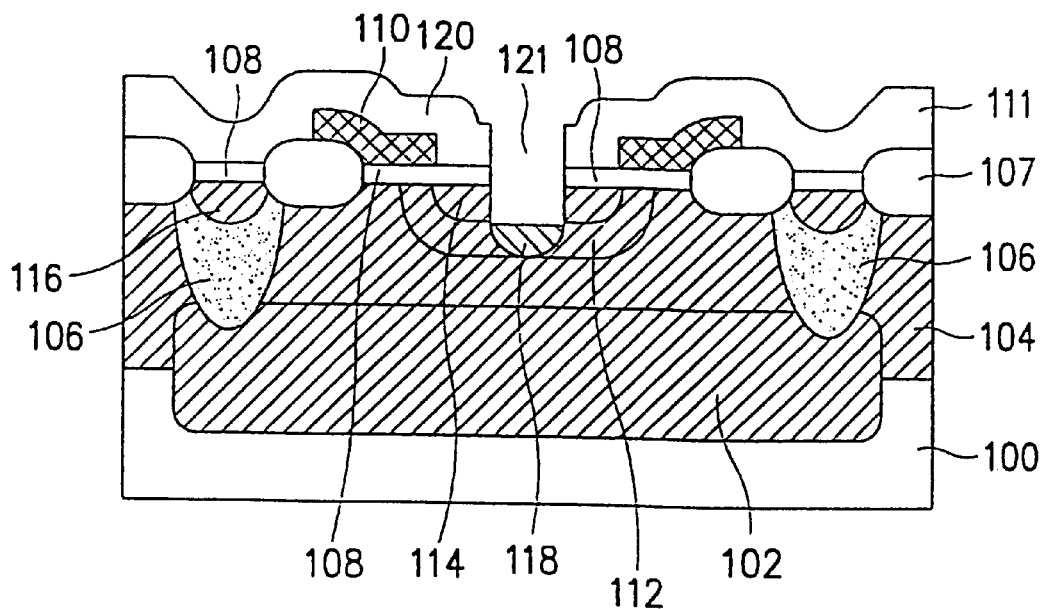

FIG. 8 illustrates the step of forming the insulating layer 120. After the P+ bulk bias region 118 is formed, the photoresist pattern 117 is removed. Then, the insulating layer 120 is formed by depositing, for example, a low-temperature oxide (LTO) on the resultant structure. To form a source and a body contact, the insulating layer 120 is etched over the area having a width smaller than that of the N+ source region 114 by photolithography and then the exposed N-type epitaxial layer 104 is etched to the P-type body region 112, thereby forming a first contact hole 121 for exposing the N+ source region 114 and the P-type body region 112.

Figure 9:
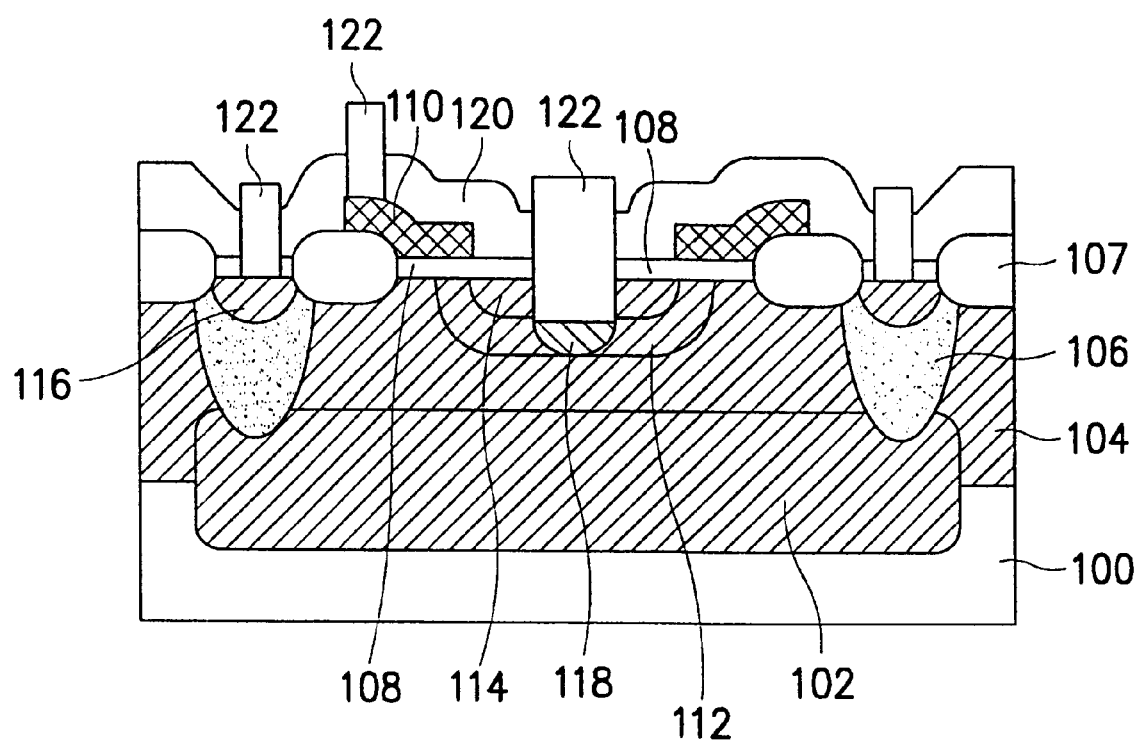

FIG. 9 illustrates the step of forming metal layers 122. After the first contact hole 121 is formed, a second contact hole and a third contact hole (both not shown) are formed by etching the insulating layer 120 on the N+ drain region 116 and the gate electrode 110, respectively to expose the N+ drain region 116 and the gate electrode 110.

Then, a metal material is deposited on the resultant structure and patterned by photolithography. Thus, the metal layer 122 is formed to contact with the N+ source region 114 and the P-type body region 120 via the first contact hole 121, the N+ drain region 116 via the second contact hole, and the gate electrode 110 via the third contact hole. As a result, the DMOS transistor is completed.

According to the DMOS transistor of the present invention as described above, an area for bulk bias is saved because a bulk bias region of a second conductive type is formed under a source region of a first conductive type. Thus, chip size and on-resistance are reduced.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A double-diffused MOS transistor comprising:
   a semiconductor substrate;
   a buried layer of a first conductive type formed on the semiconductor substrate;
   an epitaxial layer of the first conductive type formed over the semiconductor substrate and the buried layer;
   a gate insulating film formed over the epitaxial layer;
   a gate electrode formed over the gate insulating film;
   a source region of the first conductive type formed in the surface of the epitaxial layer in self-alignment with the gate electrode;
   a drain region of the first conductive type formed in the surface of the epitaxial layer in non-self-alignment with the gate electrode;
   a body region of a second conductive type formed in the surface of the epitaxial layer and surrounding the source region; and
   a bulk bias region of the second conductive type formed below the source region, at a greater depth than the source region,
   wherein a top of the source region is higher than a top of the bulk bias region.

2. The double-diffused MOS transistor as recited in claim 1, further comprising a sink region of the first conductive type formed from under the drain region to the buried layer to reduce drain resistance.

3. The double-diffused MOS transistor as recited in claim 1, further comprising:
   an insulating layer formed over the epitaxial layer and the gate electrode; and
   a metal layer formed over the insulating layer, for making contact with the gate electrode, the source and drain regions, and the bulk bias region,
   wherein the metal layer makes contact with the top surface of the bulk bias region and a sidewall of the source region.

4. A double-diffused MOS transistor fabricating method comprising the steps of:
   sequentially forming a buried layer of a first conductive type and an epitaxial layer of the first conductive type over a semiconductor substrate;
   forming a gate insulating film over the epitaxial layer;
   forming a gate electrode over the gate insulating film;
   forming a body region of a second conductive type in the surface of the epitaxial layer by ion-implanting an impurity of the second conductive type using a photomask;
   forming a source region of the first conductive type into the surface of the epitaxial layer by ion-implanting an impurity of the first conductive type into the surface of the resultant structure;
   forming a drain region of the first conductive type into the surface of the epitaxial layer by ion-implanting an impurity of the first conductive type into the surface of the resultant structure; and
   forming a bulk bias region of the second conductive type below the source region by ion-implanting an impurity of the second conductive type into an area having a width smaller than that of the source region using a photomask.

5. A double-diffused MOS transistor fabricating method as recited in claim 4, further comprising the step of forming a sink region of the first conductive type by ion-implanting an impurity of the first conductive type into a drain forming area and diffusing the ion-implanted impurity to the buried layer, to reduce drain resistance, wherein the step of forming a sink region is performed after the step of sequentially forming the buried layer and the epitaxial layer.

6. A double-diffused MOS transistor fabricating method as recited in claim 4, wherein no photomask is used in the step of forming the source and drain regions.

7. A double-diffused MOS transistor fabricating method as recited in claim 4, further comprising the steps, performed after the step of forming the bulk bias region, of:
   forming an insulating layer on the surface of the resultant structure;
   etching the insulating layer over the area having a width smaller than that of the source region, and etching the exposed epitaxial layer to the body region;
   etching the insulating layer on the drain region and the gate electrode; and
   forming a metal layer on the surface of the resultant structure.

8. A double-diffused MOS transistor comprising:
   an epitaxial layer of a first conductive type;
   a gate electrode formed over the epitaxial layer;
   a source region of the first conductive type formed in the surface of the epitaxial layer;

a drain region of the first conductive type formed in the surface of the epitaxial layer;

a body region of a second conductive type formed in the surface of the epitaxial layer and surrounding the source region; and a bulk bias region of the second conductive type formed below the source region at a depth greater than the source region, wherein a top surface of the source region is higher than a top surface of the bulk bias region.

9. A double-diffused MOS transistor as recited in claim 8, further comprising a sink region of the first conductive type formed from under the drain region to reduce drain resistance.

10. A double-diffused MOS transistor as recited in claim 8, further comprising a metal layer formed over the epitaxial layer, for making contact with the gate electrode, the source and drain regions, and the bulk bias region, wherein the metal layer makes contact with the top surface of the bulk bias region and a sidewall of the source region.

11. A double-diffused MOS transistor as recited in claim 8, where in the source region is self-aligned with the gate electrode.

12. A double-diffused MOS transistor as recited in claim 8, wherein the drain region is non-self-aligned with the gate electrode.

13. A double-diffused MOS transistor as recited in claim 10, wherein the metal layer is commonly contacted with the bulk bias region of the second conductivity type, the body region of the second conductivity type, and the source region of the first conductivity type.

* * * * *